United States Patent
Xing et al.

(10) Patent No.: US 12,154,609 B2
(45) Date of Patent: Nov. 26, 2024

(54) IN-MEMORY COMPUTING USING SOT-MRAM

(71) Applicant: INSTITUTE OF MICROELECTRONICS OF THE CHINESE ACADEMY OF SCIENCES, Beijing (CN)

(72) Inventors: Guozhong Xing, Beijing (CN); Long Liu, Beijing (CN); Di Wang, Beijing (CN); Huai Lin, Beijing (CN); Ming Liu, Beijing (CN)

(73) Assignee: INSTITUTE OF MICROELECTRONICS OF THE CHINESE ACADEMY OF SCIENCES, Beijing (CN)

( * ) Notice: Subject to any disclaimer, the term of this patent is extended or adjusted under 35 U.S.C. 154(b) by 239 days.

(21) Appl. No.: 17/821,783

(22) Filed: Aug. 23, 2022

(65) Prior Publication Data

US 2023/0046423 A1 Feb. 16, 2023

Related U.S. Application Data

(63) Continuation of application No. PCT/CN2021/118326, filed on Sep. 14, 2021.

(30) Foreign Application Priority Data

Aug. 12, 2021 (CN) .......................... 202110922939.3

(51) Int. Cl.
*G11C 11/54* (2006.01)
*G11C 11/16* (2006.01)

(52) U.S. Cl.
CPC ........ *G11C 11/1675* (2013.01); *G11C 11/161* (2013.01); *G11C 11/1673* (2013.01); *G11C 11/54* (2013.01)

(58) Field of Classification Search
CPC .............. G11C 11/1675; G11C 11/161; G11C 11/1673; G11C 11/54
See application file for complete search history.

(56) References Cited

U.S. PATENT DOCUMENTS

2017/0365777 A1* 12/2017 Mihajlovic ............ H10N 50/10
2019/0115060 A1* 4/2019 Deshpande ......... G11C 11/1673
(Continued)

FOREIGN PATENT DOCUMENTS

CN 110197682 A 9/2019
CN 110660420 A 1/2020
(Continued)

OTHER PUBLICATIONS

International Search Report prepared by the State Intellectual Property Office of the P.R. China for PCT/CN2021/118326, May 7, 2022, 4 pages.
(Continued)

*Primary Examiner* — Mushfique Siddique
(74) *Attorney, Agent, or Firm* — Syncoda LLC; Feng Ma

(57) ABSTRACT

A magnetoresistive memory cell includes a first magnetic tunnel junction, a second magnetic tunnel junction and a metal layer. The first magnetic tunnel junction and the second magnetic tunnel junction each are disposed on the metal layer; the metal layer is configured to pass write current, a projection line of an easy axis of the first magnetic tunnel junction on a plane where the metal layer is located forms a first angle against a direction of the write current, and a projection line of an easy axis of the second magnetic tunnel junction on the plane where the metal layer is located forms a second angle against a direction opposite to the direction of the write current; the first angle and the second (Continued)

angle are all less than 90°; the first magnetic tunnel junction and the second magnetic tunnel junction are configured to pass read current.

8 Claims, 6 Drawing Sheets

(56) References Cited

U.S. PATENT DOCUMENTS

| 2021/0210127 A1* | 7/2021 | Drouard | G11C 11/161 |
| 2022/0254993 A1* | 8/2022 | Zhao | H10N 50/80 |
| 2022/0291898 A1* | 9/2022 | Yoda | H01F 10/329 |
| 2022/0406392 A1* | 12/2022 | Wang | G11C 7/16 |

FOREIGN PATENT DOCUMENTS

| CN | 110782027 A | 2/2020 | |
| CN | 112420095 A | 2/2021 | |
| CN | 113451356 A * | 9/2021 | H01L 27/222 |

OTHER PUBLICATIONS

Written Opinion prepared by the State Intellectual Property Office of the P.R. China for PCT/CN2021/118326, May 7, 2022, 4 pages.

* cited by examiner

IN-MEMORY COMPUTING USING SOT-MRAM

CROSS-REFERENCE TO RELATED APPLICATIONS

This application is a continuation of International Application No. PCT/CN2021/118326 filed on Sep. 14, 2021, which claims priority to Chinese Patent Application No. 202110922939.3 filed on Aug. 12, 2021. The disclosures of the above-referenced applications are hereby incorporated by reference in their entirety.

BACKGROUND

Convolutional Neural Network (CNN) has been widely applied in various fields, such as image recognition, speech recognition, natural language processing, and has presented its excellent performance. However, due to its huge demand for storage and computing resources, hardware implementation of a large-scale convolutional neural network has been restricted. Binary Neural Network (BNN) reduces storage resource overhead by binarizing synaptic weights and neuron inputs and outputs of a convolutional neural network, and simplifies computing works by replacing high-precision multiplication with dot product so as to lower the burden of computing resources. At the same time, it has demonstrated comparable accuracy to the CNN on various large-scale datasets. Therefore, the BNN has won more and more attention, which provides a solution for the hardware implementation of the deep neural network. Hardware neural networks based on a traditional Von Neumann Architecture are difficult to be integrated and applied on a large scale due to problems of Memory Wall and Power Consumption Wall. In recent years, with the development of In-Memory Computing (IMC) platforms based on a new non-volatile memory, the hardware neural networks has been brought into a new stage of development. Among various new types of non-volatile memory, Spin-Orbit Torque Magnetic Random Access Memory (SOT-MRAM) is potentially to be an universal memory of the next generation because of its advantages, such as high read and write speeds, unlimited number of erasing and rewriting, long data retention time, low write power consumption, and compatibility with CMOS (Complementary Metal Oxide Semiconductor) process, and it thus have been widely used in the researches of in-memory computing platforms and hardware neural networks.

However, the SOT-MRAM is not conducive to large-scale integration at present as it has a three-terminal structure and can hardly achieve deterministic magnetization reversal without assistance of an external magnetic field, and its low tunnel magneto resistance (TMR) has limited the read performance thereof, which results in a higher read error rate.

SUMMARY

The present disclosure relates to the technical field of integrated circuits, and in particular, to a magnetoresistive memory cell, a write control method, and a memory computing module.

An objective of the present disclosure is, at least in part, to provide a magnetoresistive memory cell, a write control method, and a memory computing module.

In a first aspect of the present disclosure, provided is a magnetoresistive memory cell, comprising: a first magnetic tunnel junction, a second magnetic tunnel junction, and a metal layer; the first magnetic tunnel junction and the second magnetic tunnel junction are each disposed on the metal layer; the metal layer is configured to pass write current; a projection line of an easy axis of the first magnetic tunnel junction on a plane where the metal layer is located forms a first angle against a direction of the write current, and a projection line of an easy axis of the second magnetic tunnel junction on the plane where the metal layer is located forms a second angle against a direction opposite to the direction of the write current, wherein the first angle and the second angle are all less than 90°; and the first magnetic tunnel junction and the second magnetic tunnel junction are configured to pass read current.

In some embodiments, cross sections of the first magnetic tunnel junction and the second magnetic tunnel junction are both ellipses.

In some embodiments, the first angle and the second angle are equal in size.

In some embodiments, sizes of the first angle and the second angle range from 30° to 60°.

In some embodiments, the first angle and the second angle are both 45° in size.

In some embodiments, the first magnetic tunnel junction and the second magnetic tunnel junction each comprise: a synthetic ferrimagnetic layer, a ferromagnetic reference layer, a barrier layer, and a ferromagnetic free layer; the ferromagnetic free layer is disposed on the metal layer; the barrier layer is disposed on a side of the ferromagnetic free layer away from the metal layer, and the ferromagnetic reference layer is disposed on a side of the barrier layer away from the metal layer, and the synthetic ferrimagnetic layer is disposed on a side of the ferromagnetic reference layer away from the metal layer; and magnetization directions of the ferromagnetic reference layers in the first magnetic tunnel junction and the second magnetic tunnel junction are identical with each other.

In some embodiments, the magnetoresistive memory may further comprise a first transistor, a second transistor and a third transistor. The first transistor is connected to a side of the first magnetic tunnel junction away from the metal layer, and the second transistor is connected to a side of the second magnetic tunnel junction away from the metal layer, and the third transistor is connected to a first end of the metal layer in a lateral direction.

In a second aspect of the disclosure, provided is a write control method for a magnetoresistive memory cell, which is applied to the magnetoresistive memory cell according to any magnetoresistive memory cell mentioned in the above first aspect, and the write control method comprises: passing a write current through the metal layer along a first direction so that the magnetoresistive memory cell is in a first storage state, the first storage state referring to that: the first magnetic tunnel junction is in a high resistance state, while the second magnetic tunnel junction is in a low resistance state; or alternatively, passing a write current through the metal layer in a second direction so that the magnetoresistive memory cell is in a second storage state, the second storage state referring to that: the first magnetic tunnel junction is in the low resistance state, while the second magnetic tunnel junction is in the high resistance state; wherein the first direction and the second direction are opposite with each other.

In a third aspect of the disclosure, provided is a memory computing module of a BNN chip, comprising a synapse array composed of the magnetoresistive memory cells according to any one magnetoresistive memory cells mentioned in the above first aspect, wherein the synapse array is configured to store synaptic weights.

In some embodiments, in the synapse array, each column of the magnetoresistive memory cells correspondingly stores synaptic weights of a neuron; the memory computing module is configured to determine an output of a target neuron to be 1 upon a sum of a plurality of synaptic weights in a column related to the target neuron is positive; the target neuron is any neuron, and each magnetoresistive memory cell corresponds to one synaptic weight; and the memory computing module is further configured to determine an output of the target neuron to be 0 upon the sum of the plurality of synaptic weights in the column related to the target neuron is negative; and, for each magnetoresistive memory cell, the memory computing module is further configured to record a synaptic weight related to a certain magnetoresistive memory cell as 1 upon the read current of the first magnetic tunnel junction is higher than the read current of the second magnetic tunnel junction, and record the synaptic weight related to the magnetoresistive memory cell as −1 upon the read current of the first magnetic tunnel junction is lower than the read current of the second magnetic tunnel junction.

With the magnetoresistive memory cell according to the embodiments of the present disclosure, as the first magnetic tunnel junction and the second magnetic tunnel junction are disposed on the metal layer, and are deflected by the first angle and the second angle, respectively, in an opposite manner, ultra-rapid fully electronically controlled magnetization reversal can be realized without assistance of an externally added magnetic field, which is conducive to large-scale integration.

The magnetoresistive memory cell according to the embodiments of the present disclosure enables configurations of the first magnetic tunnel junction and the second magnetic tunnel junction to be always opposite with each other after the reversal so that a complementary structure is formed to store one bit. When information is read, reading can be implemented using a self-reference mechanism, which improves a reading margin and thereby enhances reading reliability and reduces reading delay. Moreover, no external magnetic field is required to enable the reversal during operation.

The magnetoresistive memory cell according to the embodiments of the present disclosure can realize a 1R1W (one read and one write) dual-port memory array based on 3T2SOT MTJ (3 transistors, and 2 spin-orbit torque magnetic tunnel junctions), which can read and write with divided blocks at the same time, greatly improving efficiency of reading and writing and improving parallelism of memory cells.

The memory computing module of the BNN chip according to the embodiments of the present disclosure performs optimization in a perspective of algorithm so that, when the synapse array is read, reading can be performed for an entire column, while the sum of the synaptic weights is implemented simultaneously, thereby greatly improving parallelism of the BNN chip.

BRIEF DESCRIPTION OF THE DRAWINGS

In order to illustrate the technical solutions in the embodiments of the present disclosure in a clear manner, the accompanying drawings to be used for the description of embodiments will be briefly explained below. Apparently, the figures presented in the following description are some of the embodiments of the present disclosure. Thus, for those of ordinary skill in the art, other figures can also be obtained according to these figures without any creative work.

Reference signs in the figures: 11—first magnetic tunnel junction; 12—second magnetic tunnel junction; 101—synthetic ferrimagnetic layer; 102—ferromagnetic reference layer; 103—potential barrier layer; 104—ferromagnetic free layer; 21—metal layer; 31—current path; 401—first transistor; 402—second transistor; 403—third transistor; 511—write driver; 512—column decoder; 611—sense amplifier; 711—row decoder; 811—source line driver; 812—source line decoder.

DETAILED DESCRIPTION

Hereinafter, the embodiments of the present disclosure will be described with reference to the accompanying drawings. It should be understood, however, that these descriptions are for illustrative purpose only, and are not intended to limit the scope of the present disclosure. Also, descriptions of well-known structures and techniques are omitted in the following description to avoid unnecessarily obscuring the concepts of the present disclosure.

Various structural schematic diagrams according to the embodiments of the present disclosure are illustrated in the accompanying drawings. These figures are not plotted in scale, so some details have been exaggerated for clarity, and some details may be omitted. As to various regions and layers shown in the figures, the shapes thereof as well as their relative sizes and positional relationships are only exemplary, and may be varied slightly in practice due to manufacturing tolerances or technical limitations, and regions or layers with different shapes, sizes, relative positions can be additionally designed as desired by those skilled in the art.

In the context of the present disclosure, when a layer or element is described as being "on" another layer or element, the layer or element can be directly located on the another layer or element or there may be intervening layers or elements therebetween. In addition, if a layer or element is "on" another layer or element in a certain orientation, then in the case that the orientation is reversed, the layer or element can be "beneath" the another layer or element.

Figure 1:
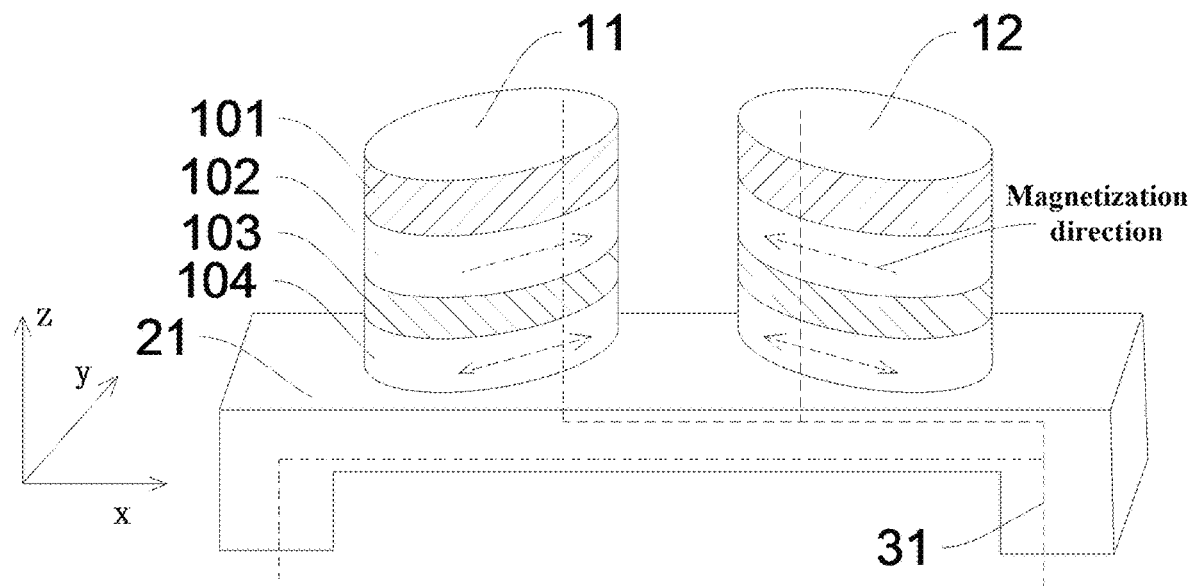
FIG. 1 shows a schematic diagram of a structure of a magnetoresistive memory cell according to one or more embodiments of the present disclosure.

Referring to FIG. 1, in an aspect of the present disclosure, a magnetoresistive memory cell is provided including a first magnetic tunnel junction (MTJ) 11, a second magnetic tunnel junction 12, and a metal layer 21.

The first magnetic tunnel junction 11 and the second magnetic tunnel junction 12 are both disposed on the metal layer 21. The metal layer 21 is configured to pass write current.

For example, in the magnetoresistive memory cell shown in FIG. 1, the write current can be along a positive direction in an x-axis, or along a negative direction in the x-axis. The write current is the current that passes while information is being written into the magnetoresistive memory cell.

Structures of the first magnetic tunnel junction 11 and the second magnetic tunnel junction 12 are the same, and a projection line of an easy axis of the first magnetic tunnel junction 11 on a plane where the metal layer 21 is located forms a first angle against the direction of the write current, and a projection line of an easy axis of the second magnetic tunnel junction 12 on the plane where the metal layer 21 is located forms a second angle against a direction opposite to the direction of the write current, and the first angle and the second angle are all less than 90°. The first and second magnetic tunnel junctions 11, 12 are configured to pass read current. The read current is the current that passes while the information stored in the magnetoresistive memory cell is being read.

As the first and second magnetic tunnel junctions 11, 12 are antisymmetric after they are positioned on the metal layer 21 and at this time, magnetization directions of the first and second magnetic tunnel junctions 11, 12 are always opposite with each other while the write current is passing through the metal layer 21 so that configurations of the two magnetic tunnel junctions can be always opposite and in a complementary state with each other. In this way, upon passing of the writing currents of different directions, the first magnetic tunnel junction 11 and the second magnetic tunnel junction 12 can respectively exhibit a high-resistance/low-resistance state or a low-resistance/high-resistance state, respectively. Thus, when the read current passes the first and second magnetic junctions 11, 12, varied information can be obtained by comparing amplitudes of the read currents of the two magnetic tunnel junctions. During an entire reading and writing process, an ultra-rapid fully electronically controlled magnetization reversal at sub-nanosecond level can be achieved by using the write currents without an external magnetic field.

In some embodiments, cross sections of the first and second magnetic tunnel junctions 11, 12 are both ellipses. It should be noted that, the ellipse in this embodiment can be optimally a strict ellipse. However, due to limitation of process etc., the ellipse can also be a rough ellipse. The first magnetic tunnel junction 11 and the second magnetic tunnel junction 12 each may be an elliptical cylinder as a whole.

Figure 2:
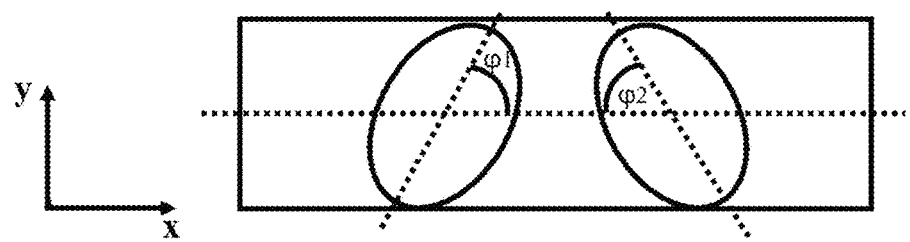
FIG. 2 shows a schematic diagram of deflection angles of magnetic tunnel junctions of the magnetoresistive memory cell of FIG. 1.
Figure 3:
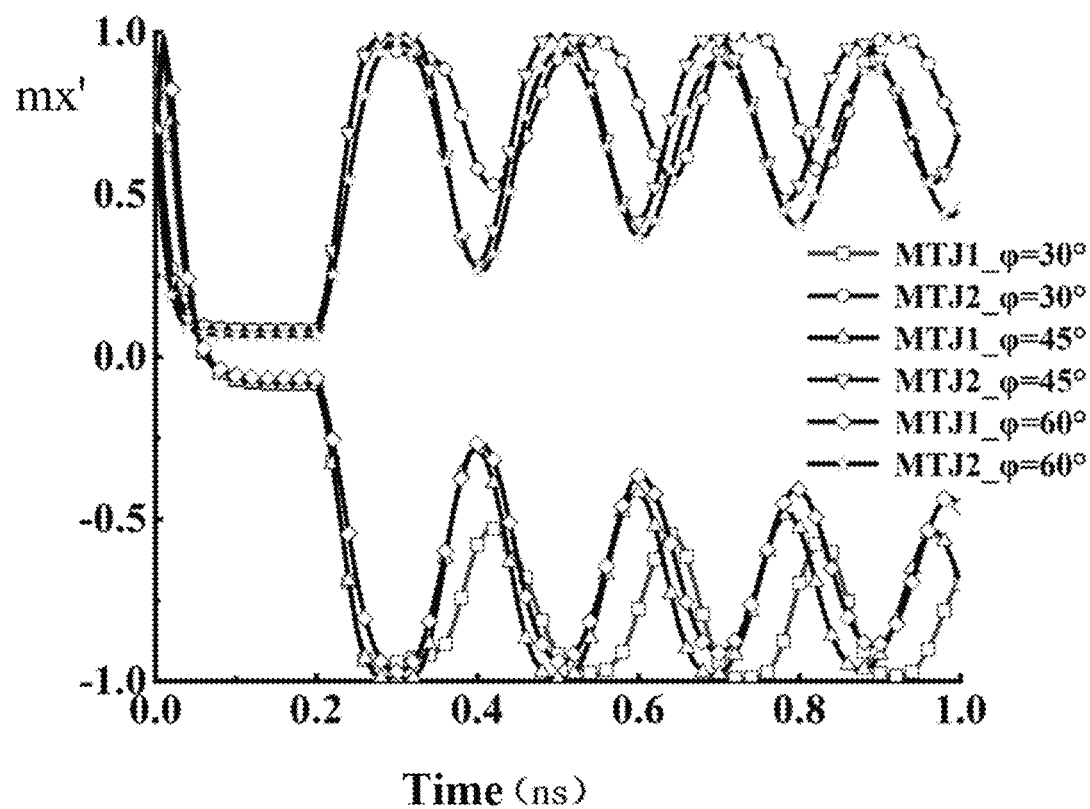
FIG. 3 shows a schematic diagram of magnetization reversal of the magnetic tunnel junctions of the magnetoresistive memory cell of FIG. 1 while being driven by the current in a +x direction.
Figure 4:
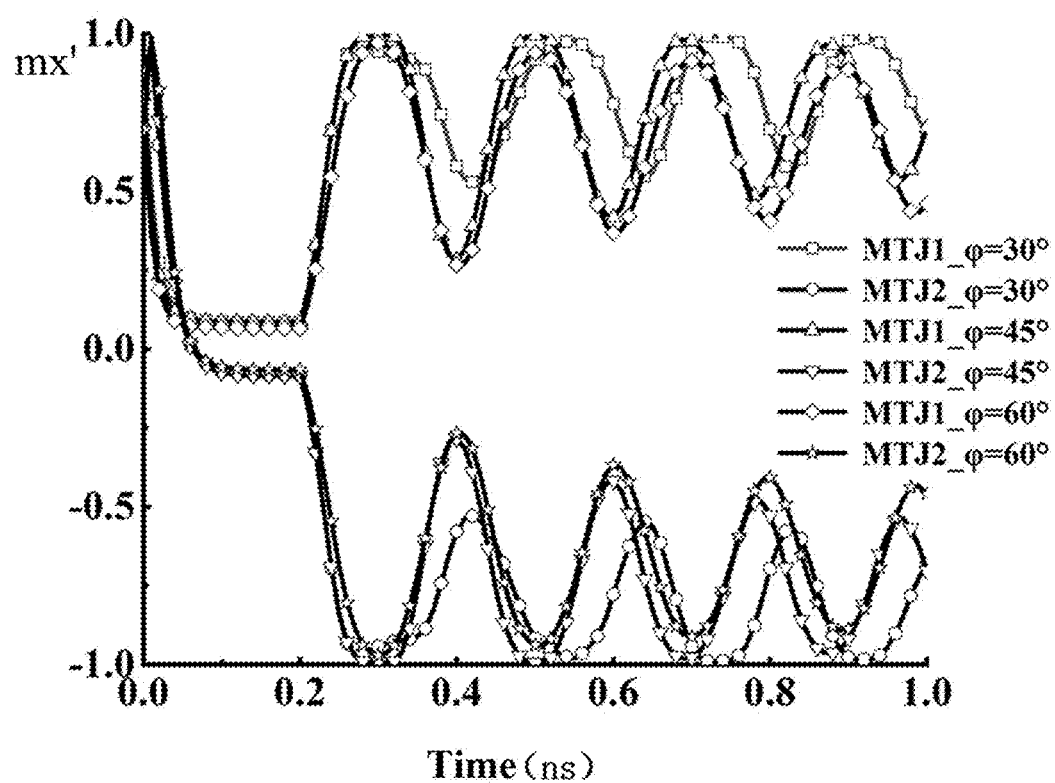
FIG. 4 shows a schematic diagram of magnetization reversal of the magnetic tunnel junctions of the magnetoresistive memory cell of FIG. 1 while being driven by the current in a −x direction.

In some embodiments, sizes of the first angle and the second angle should be equal to ensure that the first magnetic tunnel junction 11 and the second magnetic tunnel junction 12 have the same magnetization reversal effect, so that information reading and writing is more stable and reliable. As shown in FIG. 2, the size $\varphi 1$ of the first angle is equal to the size $\varphi 2$ of the second angle. Further, a range of the sizes of the first and second angles may be determined as 30°-60°, which can ensure an appropriate threshold current to enable magnetization reversal without assistance of an external field. Through experiments on the magnetoresistive memory cell in this embodiment, obtained is response graphs of micromagnetic simulation results of the current-driven magnetization reversal as shown in FIGS. 3 and 4, wherein the ordinate refers to a normalized value of the x' component of a magnetization (mx') along the canted easy axis direction. It can be seen from FIGS. 3 and 4 that a good magnetization reversal effect can be achieved when the sizes of the first angle and the second angle range from 30° to 60°. For example, the sizes of the first and second angles may be 35°, 45°, 55°, etc. In FIG. 3, in the case that the current is in the +x direction, the first magnetic tunnel junction 11 is reversed while the second magnetic tunnel junction 12 is not reversed; and in FIG. 4, in the case that the current is the -x direction, the first magnetic tunnel junction 11 is not reversed while the second magnetic tunnel junction 12 is reversed.

Figure 5:
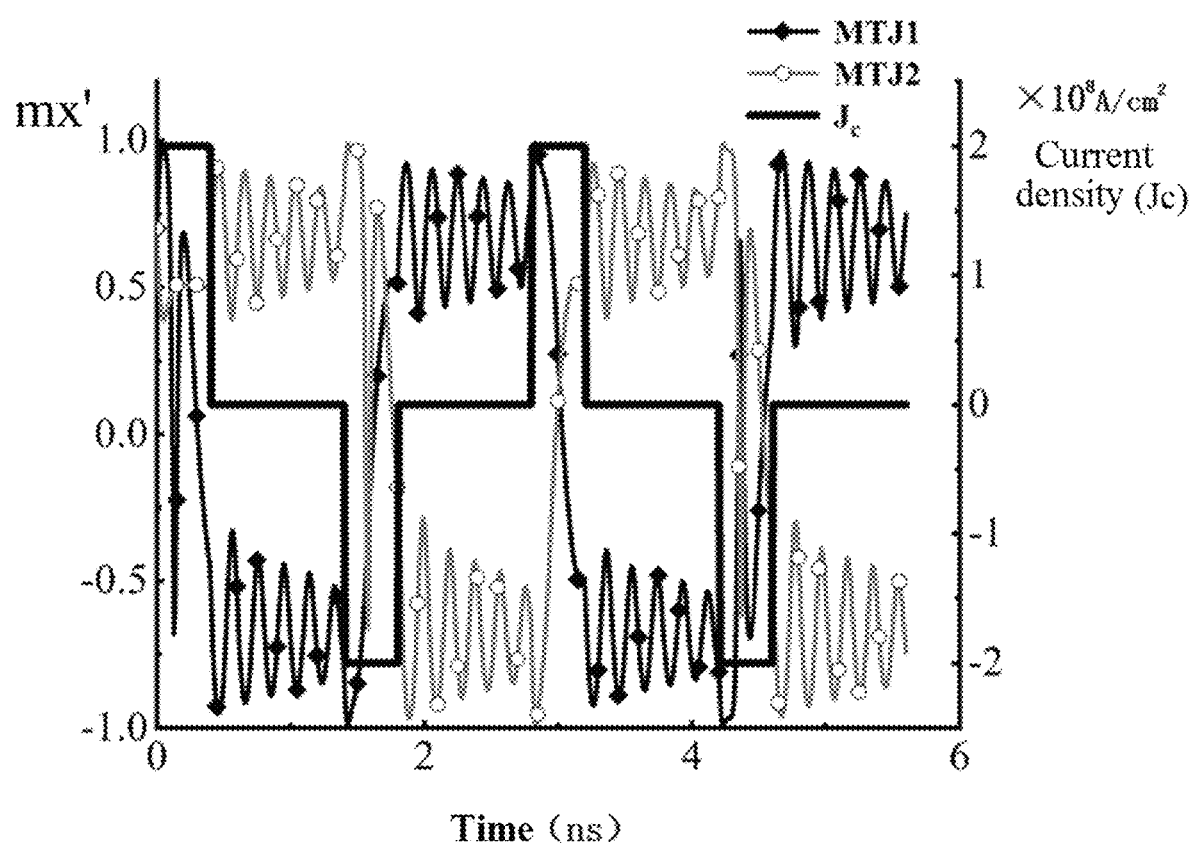
FIG. 5 shows a schematic diagram of magnetization reversal of the magnetic tunnel junctions of the magnetoresistive memory cell of FIG. 1 while being subject to the action of continuous bipolar pulses.

Continually referring to FIG. 5, reversal of the first and second magnetic tunnel junctions 11, 12 under the action of continuous bipolar pulses is shown. Under the action of a first pulse, magnetization directions of the first magnetic tunnel junction 11 and the second magnetic tunnel junction 12 are switched from a parallel state to an anti-parallel state, namely, to complete initialization. Under the action of the subsequent pulses, the first magnetic tunnel junction 11 and the second magnetic tunnel junction 12 are always opposite in the magnetization directions as well as related storage states, and have rapid responses of the magnetization reversal and higher reliability, thereby enabling the ultra-rapid fully electronically controlled magnetization reversal without assistance of an external magnetic field.

In some embodiments, implementations for the first magnetic tunnel junction 11, the second magnetic tunnel junction 12 and the metal layer 21 are as following.

The first and second magnetic tunnel junctions 11, 12 may each include: a synthetic ferrimagnetic layer 101, a ferromagnetic reference layer 102, a barrier layer 103, and a ferromagnetic free layer 104. The ferromagnetic free layer 104 is disposed on the metal layer 21; the barrier layer 103 is disposed on a side of the ferromagnetic free layer 104 away from the metal layer 21; the ferromagnetic reference layer 102 is disposed on a side of the barrier layer 103 away from the metal layer 21; and the synthetic ferrimagnetic layer 101 is disposed on a side of the ferromagnetic reference layer 102 away from the metal layer 21. The magnetization directions of the ferromagnetic reference layers 102 in the first magnetic tunnel junction 11 and the second magnetic tunnel junction 12 are the same.

The synthetic ferrimagnetic layer 101 has a superimposed multi-layer structure. It can be implemented by using an existing composition method.

The ferromagnetic reference layer 102 may be one or a combination of CoFeB, CoNi, Co, CoPt, etc.; and other existing implementation manners may be adopted. The magnetization directions of the ferromagnetic reference layers 102 of the first magnetic tunnel junction 11 and the second magnetic tunnel junction 12 are the same.

The barrier layer 103 may be one of MgO or $Al_2O_3$, and the ferromagnetic free layer 104 may use in-plane anisotropic ferromagnetic materials, for example, one or a combination of CoFeB, CoNi, Co, CoPt etc. The ferromagnetic free layer 104 can enable the reversal under the action of the write current.

The metal layer 21 may be composed of heavy metal materials. For example, any one or more of Pt, Ta, and W may be used.

Figure 6:
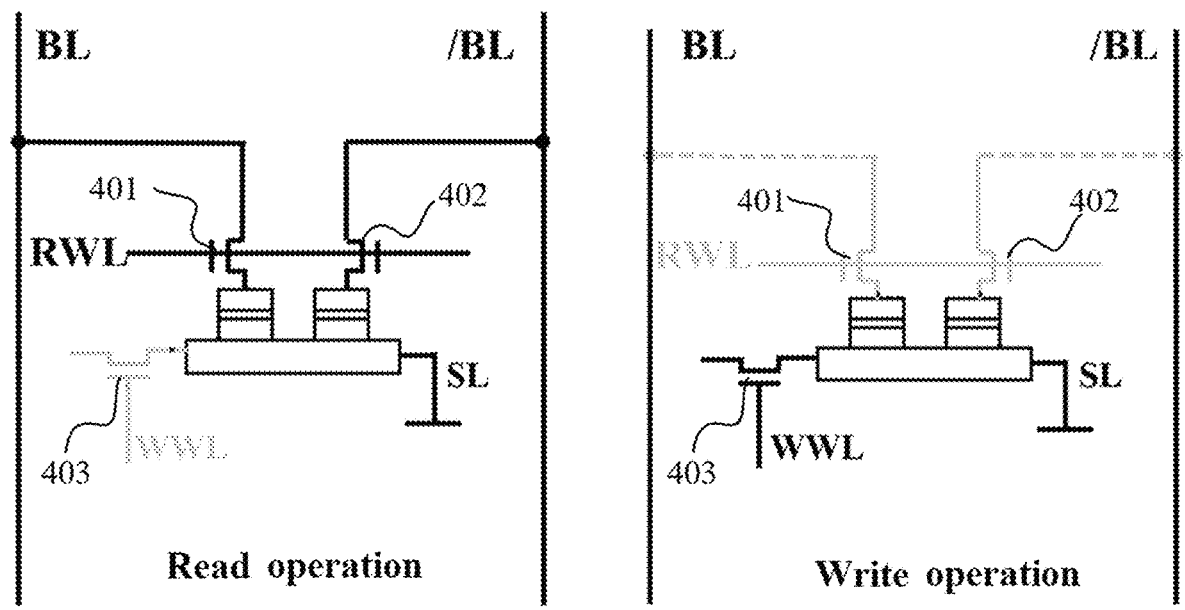
FIG. 6 shows schematic diagram of the principle that the magnetoresistive memory cell of FIG. 1 is controlled to read and write by using 3 transistors.

In a possible implementation, the magnetoresistive memory cell further includes: a first transistor 401, a second transistor 402, and a third transistor 403. The first transistor 401 is connected to a side of the first magnetic tunnel junction 11 away from the metal layer 21; the second transistor 402 is connected to a side of the second magnetic tunnel junction 12 away from the metal layer 21, and the third transistor 403 is connected to a first end in a lateral direction of the metal layer 21, and a second end in the lateral direction of the metal layer 21 serves as an input or output end. Therefore, in this implementation, it is just three transistors to be used to enable the read and write control of the magnetoresistive memory cell, which realizes a unit circuit of a 3T2SOT MTJ (3 transistors, 2 spin-orbit torque magnetic tunnel junctions) device, as shown in FIG. 6. Input ends of the first transistor 401 and the second transistor 402 are further connected to a first bit line and a second bit line, i.e., the first bit line BL and the second bit line/BL, respectively, and bit lines are configured to supply the read current. Control ends of the first transistor 401 and the second transistor 402 may be connected to a read control word line, i.e., the read control word line RWL. The read control word line is configured to provide a signal for controlling the first and second transistors 401, 402 to turn on or off. An input end of the third transistor 403 can be connected to any word line, and a control end of the third transistor 403 is connected to a write control word line, i.e., the write control word line WWL. The write control word line is configured to provide a signal for controlling the third transistor 403 to turn on or off. The second end of the metal layer 21 is used as the input or output end by connecting a source line, i.e., the source line SL; and the source line SL may be grounded or pulled up according to a desired current polarity.

No limitation is made to types of the first transistor 401, the second transistor 402 and the third transistor 403. Through the first transistor 401, the second transistor 402 and the third transistor 403, independent regulation for a read operation circuit and a write operation circuit of the magnetoresistive memory cell can be achieved. Based on this feature, a 1R1W (one read and one write) dual-port memory cell can be realized, which can greatly improve read and write efficiency and improve parallelism of the memory cells, as shown in FIG. 1.

In some embodiments, when the magnetoresistive memory cell is subject to write operation, the process thereof may be as following.

The write current along a first direction passes through the metal layer 21 so that the magnetoresistive memory cell is in a first storage state, wherein the first storage state refers to that the first magnetic tunnel junction 11 is in a high resistance state, and the second magnetic tunnel junction 12 is in a low resistance state.

For example, in the case that directions of the ferromagnetic reference layers 102 of both the first magnetic tunnel junction 11 and the second magnetic tunnel junction 12 are along the +x' direction and the first direction refers to the +x' direction, then the magnetization direction of the first magnetic tunnel junction 11 is along the −x' direction, and the magnetization direction of the second magnetic tunnel junction 12 is along the +x' direction, as shown in FIG. 3. At this time, in the first magnetic tunnel junction 11, a magnetization direction of the ferromagnetic free layer 104 is antiparallel to that of the ferromagnetic reference layer 102, and the first magnetic tunnel junction 11 is in the high resistance state; and in the second magnetic tunnel junction 12, a magnetization direction of the ferromagnetic free layer 104 is parallel to that of the ferromagnetic reference layer 102, and the second magnetic tunnel junction 12 is in the low resistance state.

In some embodiments, the write current along a second direction passes though the metal layer 21 so that the magnetoresistive memory cell is in a second storage state, wherein the second storage state refers to that the first magnetic tunnel junction 11 is in the low resistance state, and the second magnetic tunnel junction 12 is in the high resistance state, wherein the first direction is opposite to the second direction.

For example, in the case that directions of the ferromagnetic reference layers 102 of both the first magnetic tunnel junction 11 and the second magnetic tunnel junction 12 are along the +x' direction and the first direction refers to the −x' direction, then the magnetization direction of the first magnetic tunnel junction 11 is along the +x' direction, and the magnetization direction of the second magnetic tunnel junction 12 is along the −x' direction, as shown in FIG. 4. At this time, in the first magnetic tunnel junction 11, the magnetization direction of the ferromagnetic free layer 104 are parallel to that of the ferromagnetic reference layer 102, and the first magnetic tunnel junction 11 is in the low resistance state; and in the second magnetic tunnel junction 12, the magnetization direction of the ferromagnetic free layer 104 is antiparallel to that of the ferromagnetic reference layer 102, and the second magnetic tunnel junction 12 is in the high resistance state.

For easy understanding, an example for writing information below is continually referred to:

When writing is performed, a level of the write control word line may be pulled up and a level of the read control word line may be pulled down so that the first transistor 401 and the second transistor 402 are turned off while the third transistor 403 is turned on. Then, the source line is connected to a low level, a current path flowing through the metal layer 21 is formed between the third transistor 403 and the source line, and the metal layer 21 converts the current along the x-axis into spin current in which spin is polarized along the y-axis by the Hall effect or the Rashaba effect. The spin current is injected into the ferromagnetic free layer 104 along the z-axis to generate spin-orbit torque so as to enable magnetization reversal of the ferromagnetic free layer 104, realizing information writing. The writing process can be completed in only one step with high writing efficiency and high speed.

Correspondingly, an example for reading information below is continually referred to:

When a read operation is performed on the magnetoresistive memory cell, the level of the write control word line may be controlled to be pulled down and the level of the read control word line may be pulled up so that the first transistor 401 and the second transistor 402 are turned on and the third transistor 403 is turned off; and at the same time, the source line is connected to a low level. As a result, a current path flowing through the first magnetic tunnel junction 11 is formed between the first bit line and the source line; a current path flowing through the second magnetic tunnel junction 12 is formed between the second bit line and the source line; and the current on the first bit line and the second bit line may be fed into a current-mode sense amplifier to compare and read out a memory state of the memory cell. Upon determining the storage state of the magnetoresistive memory cell, an algorithmic definition can be performed that, for example, a synaptic weight corresponding to $I_{BL}>I_{/BL}$ may be defined as "1", and a synaptic weight corresponding to $I_{BL}<I_{/BL}$ may be defined as "−1". Apparently, other definitions may also be made in other embodiments, for example, $I_{BL}>I_{/BL}$ corresponds to a synaptic weight "−1", and $I_{BL} < I_{/BL}$ corresponds to a synaptic weight "1", which is not limited any further.

The current paths 31 for reading and writing information are illustrated in FIG. 1.

It can be seen from the above examples that the magnetoresistive memory cell of this embodiment enables the configurations of the first magnetic tunnel junction 11 and the second magnetic tunnel junction 12 to be always opposite with each other after the reversal, thereby forming a complementary structure to store one bit. Reading information can be implemented through a self-referencing mechanism when the information is read. Therefore, the magnetoresistive memory cell of this embodiment can improve a read margin, thereby enhancing reading reliability and reducing reading delay. Moreover, no external magnetic field is required to enable the reversal during operation, which is beneficial to large-scale integration.

Figure 7:
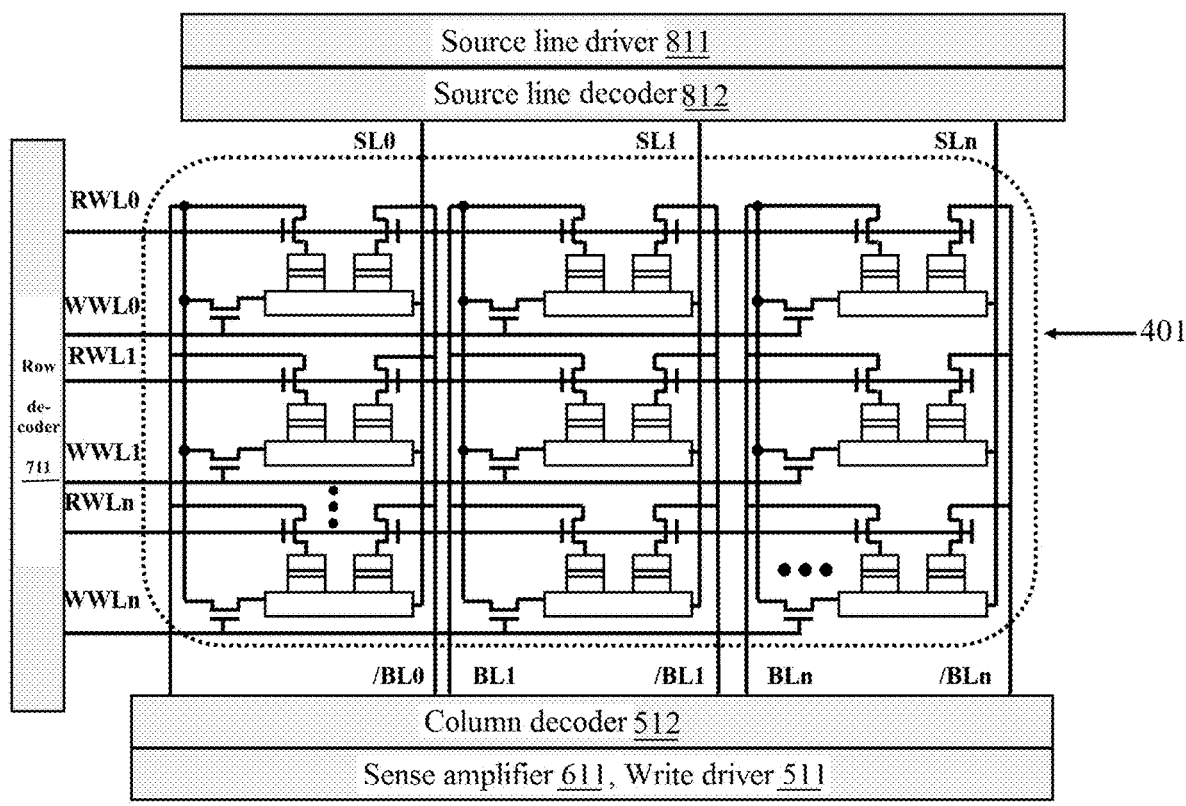
FIG. 7 shows a schematic diagram of a structure of a synapse array of a memory computing module in a BNN chip according to one or more embodiments of the disclosure.

Referring to FIG. 7, in yet another embodiment of the present disclosure, further provided is a memory computing module in a BNN chip, which includes a synapse array composed of any magnetoresistive memory cells in the foregoing embodiments. The synapse array is configured to store synapse weights. In the synapse array, each column of magnetoresistive memory cells correspondingly stores synaptic weights of a neuron. The first transistors 401 and the third transistors 403 of the magnetoresistive memory cells in each column are connected to a first bit line, and the second transistors 402 are each connected to a second bit line. It should be noted that, in other embodiments, the third transistors 403 can also be connected to the second bit line and controlled by a signal from the second bit line. The control ends of both the first transistors 401 and the second transistors 402 of magnetoresistive memory cells in each row are each connected to a read control word line, and the control ends of the third transistors 403 are each connected to a write control word line; and each row has its own read control word lines and write control word line. The magnetoresistive memory cells of each column are connected to the same source line. During operation, a column decoder 512, a row decoder 711 and a source line decoder 812 select cells for read/write operation, and the row decoder 711 can activate a plurality of word lines simultaneously according to an input. During the read operation, total currents on the first bit line BL and the second bit line/BL in each column are delivered to a sense amplifier 611 for comparison to determine an output value. During the write operation, a write driver 511 and a source line driver 811 provide write current pulses.

It should be noted that the above-mentioned drivers and decoders in the present embodiment can be implemented with reference to existing implementation schemes, which will not be described any further in the present embodiment.

The memory computer module is configured to determine an output of a target neuron to be 1 upon the sum of a plurality of synaptic weights in a column corresponding to the target neuron is positive. The target neuron may be any neuron, and each magnetoresistive memory cell corresponds to one synaptic weight. The memory computing module is further configured to determine an output of the target neuron to be 0 upon the sum of the plurality of synaptic weights in the column corresponding to the target neuron is negative. In this case, for each magnetoresistive memory cell: the memory computing module is further configured to record a synaptic weight related to a certain magnetoresistive memory cell as 1 upon the read current of the first magnetic tunnel junction 11 is higher than the read current of the second magnetic tunnel junction 12, and record the synaptic weight related to this magnetoresistive memory cell as −1 upon the read current of the first magnetic tunnel junction 11 is lower than the read current of the second magnetic tunnel junction 12.

As $R_{AP} \gg R_P$ ($R_{AP}$ refers to the resistance of the magnetic tunnel junction in the high resistance state in the case that the ferromagnetic reference layer 102 and the ferromagnetic free layer 104 are antiparallel in the magnetization directions; and $R_P$ represents the resistance of the magnetic tunnel junction in the low resistance state in the case that the ferromagnetic reference layer 102 and the ferromagnetic free layer 104 are parallel in the magnetization directions), the read current on the first bit line or the second bit line is mainly read current generated by the magnetoresistive memory cell in the low resistance state. Therefore, the difference between the current $I_{BL}$ of the first bit line and the current $I_{/BL}$ of the second bit line exactly corresponds to the difference in the number of magnetoresistive memory cells in the low resistance state in the two columns of word lines, that is, corresponds to the sum of the synaptic weights related to the magnetoresistive memory cells of a column. The current $I_{BL}$ of the first bit line and the current $I_{/BL}$ of the second bit line are delivered to the current-mode sense amplifier 611 for comparison and output. It is defined that when the sum of the synaptic weights is positive, an output of the sense amplifier is "1"; otherwise, when the sum of the synaptic weights is negative, the output of the sense amplifier is "0". Therefore, the output of the sense amplifier can be directly regarded as an output of a binary neuron.

As for the memory computing module of the BNN chip optimized by an algorithm mentioned above, when the synapse array thereof is read, reading can be performed for an entire column, while the sum of the synaptic weights is implemented simultaneously, thereby greatly improving parallelism of the BNN chip.

In addition, the features and beneficial effects of the memory computing module of the BNN chip in the present embodiment that have not been set forth in detail can refer to the description in the above embodiments of the magnetoresistive memory cell, and are not described any further in this embodiment.

Although some embodiments of the present disclosure have been described, additional changes and modifications to these embodiments may come to those skilled in the art once the basic inventive concepts have been known by them. Therefore, the appended claims are intended to be construed to cover the preferred embodiments and all changes and modifications that fall within the scope of the present disclosure.

Apparently, various changes and modifications may be made to the present disclosure by those skilled in the art without departing from the spirit and the scope of the present disclosure. Thus, provided that these modifications and variations of the present disclosure fall within the scope of the claims of the present disclosure and their equivalents, the present disclosure is further intended to include these modifications and variations.

What is claimed is:

1. A memory computing module, comprising a synapse array comprising magnetoresistive memory cells, wherein the synapse array is configured to store synaptic weights;
   wherein each of the magnetoresistive memory cells comprises: a first magnetic tunnel junction, a second magnetic tunnel junction, and a metal layer, wherein:
   the first magnetic tunnel junction and the second magnetic tunnel junction are each disposed on the metal layer;
   the metal layer is configured to pass write current;

a projection line of an easy axis of the first magnetic tunnel junction on a plane where the metal layer is located forms a first angle against a direction of the write current, and a projection line of an easy axis of the second magnetic tunnel junction on the plane where the metal layer is located forms a second angle against a direction opposite to the direction of the write current, wherein the first angle and the second angle are all less than 90°; and the first magnetic tunnel junction and the second magnetic tunnel junction are configured to pass read current;

wherein in the synapse array, each column of the magnetoresistive memory cells correspondingly stores synaptic weights of a neuron;

the memory computing module is configured to determine an output of a target neuron to be 1 upon a sum of a plurality of synaptic weights in a column related to the target neuron is positive; the target neuron is any neuron, and each magnetoresistive memory cell corresponds to one synaptic weight;

the memory computing module is further configured to determine an output of the target neuron to be 0 upon the sum of the plurality of synaptic weights in the column related to the target neuron is negative; and wherein, for each magnetoresistive memory cell, the memory computing module is further configured to record a synaptic weight related to a certain magnetoresistive memory cell as 1 upon the read current of the first magnetic tunnel junction is higher than the read current of the second magnetic tunnel junction, and record the synaptic weight related to the magnetoresistive memory cell as −1 upon the read current of the first magnetic tunnel junction is lower than the read current of the second magnetic tunnel junction.

2. The memory computing module of claim 1, wherein cross sections of the first magnetic tunnel junction and the second magnetic tunnel junction are both ellipses.

3. The memory computing module of claim 1, wherein the first angle and the second angle are equal in size.

4. The memory computing module of claim 1, wherein sizes of the first angle and the second angle range from 30° to 60°.

5. The memory computing module of claim 4, wherein the first angle and the second angle are both 45° in size.

6. The memory computing module of claim 1, wherein the first magnetic tunnel junction and the second magnetic tunnel junction each comprise: a synthetic ferrimagnetic layer, a ferromagnetic reference layer, a barrier layer, and a ferromagnetic free layer;

the ferromagnetic free layer is disposed on the metal layer;

the barrier layer is disposed on a side of the ferromagnetic free layer away from the metal layer, and the ferromagnetic reference layer is disposed on a side of the barrier layer away from the metal layer, and the synthetic ferrimagnetic layer is disposed on a side of the ferromagnetic reference layer away from the metal layer; and magnetization directions of the ferromagnetic reference layers in the first magnetic tunnel junction and the second magnetic tunnel junction are identical with each other.

7. The memory computing module of claim 1, further comprising a first transistor, a second transistor and a third transistor, wherein:

the first transistor is connected to a side of the first magnetic tunnel junction away from the metal layer, and the second transistor is connected to a side of the second magnetic tunnel junction away from the metal layer, and the third transistor is connected to a first end of the metal layer in a lateral direction.

8. A write control method applied to the memory computing module according to claim 1, wherein the write control method comprises:

passing a write current through the metal layer along a first direction so that the magnetoresistive memory cell is in a first storage state, the first storage state referring to that: the first magnetic tunnel junction is in a high resistance state, while the second magnetic tunnel junction is in a low resistance state; or passing a write current through the metal layer in a second direction so that the magnetoresistive memory cell is in a second storage state, the second storage state referring to that: the first magnetic tunnel junction is in the low resistance state, while the second magnetic tunnel junction is in the high resistance state; wherein the first direction and the second direction are opposite with each other.

* * * * *